United States Patent [19]

Jackson et al.

[11] 4,257,824
[45] Mar. 24, 1981

[54] PHOTO-INDUCED TEMPERATURE GRADIENT ZONE MELTING

[75] Inventors: Kenneth A. Jackson, Plainfield; Lionel C. Kimerling, Westfield; Harry J. Leamy, New Providence, all of N.J.

[73] Assignee: Bell Telephone Laboratories, Incorporated, Murray Hill, N.J.

[21] Appl. No.: 62,350

[22] Filed: Jul. 31, 1979

[51] Int. Cl.$^3$ .......................................... H01L 21/275
[52] U.S. Cl. .................... 148/1.5; 148/171; 148/188
[58] Field of Search .................. 148/1.5, 188, 171; 75/65 ZM

[56] References Cited

U.S. PATENT DOCUMENTS

| 2,739,088 | 3/1956 | Pfann | 75/65 ZM |
|---|---|---|---|
| 2,813,048 | 11/1957 | Pfann | 148/1 |
| 3,420,719 | 1/1969 | Potts | 148/188 |
| 3,898,106 | 8/1975 | Cline | 148/171 X |
| 3,940,289 | 2/1976 | Marquardt et al. | 148/1.5 |
| 4,059,461 | 11/1977 | Fan et al. | 148/1.5 |
| 4,131,487 | 12/1978 | Pearce et al. | 148/1.5 |
| 4,137,100 | 1/1979 | Zaleckas | 148/1.5 |
| 4,147,563 | 4/1979 | Narayan et al. | 148/1.5 |
| 4,151,008 | 4/1979 | Kirkpatrick | 148/1.5 |
| 4,154,625 | 5/1979 | Golovchenko et al. | 148/175 X |

Primary Examiner—G. Ozaki
Attorney, Agent, or Firm—Samuel H. Dworetsky

[57] ABSTRACT

A temperature gradient zone melting process is disclosed wherein the temperature gradient is established substantially across only the molten zone by preferentially heating the molten zone. In a specific embodiment, the mechanism for inputting heat to the molten zone involves exposing the substrate to optical radiation of a wavelength and magnitude for which the molten zone is absorptive and the remainder of the body is transparent. The molten zone thereby migrates through the body toward the source of optical radiation.

19 Claims, 4 Drawing Figures

PHOTO-INDUCED TEMPERATURE GRADIENT ZONE MELTING

TECHNICAL FIELD

This invention involves temperature gradient zone melting.

BACKGROUND OF THE INVENTION

The successful application of semiconductor technology to the fabrication of commercial electrical devices, and the recent strides in developing ultraminiature "chips", have been in part due to advanced semiconductor purification and doping processes. When ultra-high purity is required, the semiconductor materials may be purified by means of a zone refining technique originally disclosed by W. G. Pfann, in U.S. Pat. No. 2,739,088 issued Mar. 20, 1956. The zone refining technique makes use of the solute-solvent phase relationships characteristic of the semiconductor material. The technique depends on the fact that the semiconductor material can sustain a higher solute level in the molten state than it can in the solid state. Consequently, passing a molten zone through the semiconductor material may result in a wake or resolidified material which possesses a lower impurity concentration than the unprocessed semiconductor material. Impurities present in the material prior to processing are "caught" in the traversing molten zone and, because of the phase properties of the material, may appear in lower concentrations in the resolidified material subsequent to passage of the molten zone.

In the zone refining process, motion of the molten zone through the starting material is obtained by relative motion between the material and an appropriate heat source which produces the molten zone. In a subsequent disclosure contained in U.S. Pat. No. 2,813,048, W. G. Pfann discussed a method of zone melting in which relative motion between the heat source and the substrate is not necessary. In this new "temperature gradient zone melting process" a temperature gradient is established across the substrate resulting in the establishment of a molten zone, and its traversal across the substrate from lower temperature to higher temperature regions. The molten zone migrates under the influence of a driving force associated with diffusion within the molten zone, which arises from a concentration gradient which exists across the molten zone. The temperature gradient zone melting process, like the previously disclosed zone refining process, can be used both for purification of impure substrates, as well as for doping pure substrates. The temperature gradient zone melting process is now well established art in the field and the various physical and chemical phenomena associated with it are essentially fully understood (see, for example, W. G. Pfann, *Zone Melting* J. Wiley & Sons, 1958; L. H. Van Vlack, *Elements of Materials Science*, Addison Wesley, 1959 p. 185ff).

The temperature gradient zone melting process has been further developed by many workers in the field. These developments are discussed, for example, in a series of disclosures assigned to the General Electric Company (e.g., U.S. Pat. No. 3,898,106 and references cited therein). These embodiments of the temperature gradient zone melting process have been referred to as thermomigration—referring to the migration of the molten zone under the influence of an appropriate temperature gradient. These processes still require the establishment of a temperature gradient across the substrate as disclosed originally by W. G. Pfann in U.S. Pat. No. 2,813,048. However, in these later developments, elaborate steps are taken to avoid instabilities and non-uniformities in the process, and to increase the migration speed of the molten zone through the substrate.

Recently, the laser has been applied to semiconductor processing in a number of different areas. For example, the laser has been used to heat processed semiconductor materials so as to anneal imperfections in the crystal structure which arise during required processing steps. Such laser annealing processes are discussed for example, in U.S. Pat. No. 4,154,625 (Golovchenko-Venkatesan).

A somewhat related process is discussed in U.S. Pat. No. 3,940,289 which involves a flash melting method for producing impurity distributions in solids. In that process, at least a portion of the substrate is melted under the simultaneous influence of a heat sink and laser irradiation. Upon refreezing, the original dopant concentration of the substrate is altered, in part because of the diffusion properties of the dopant in the molten state, and in part because of the effect of the refreezing interface.

SUMMARY OF THE INVENTION

This invention is a temperature gradient zone melting process in which the temperature gradient is established substantially across only the molten zone. The mechanism for inputting heat to the molten zone is such that only the molten zone is affected by the heating mechanism during the processing of the substrate. Furthermore, the molten zone migrates toward the source of heat energy allowing the practitioner to control more effectively the migration of the zone through the substrate. The process permits the establishment of a high temperature gradient over the small volume of the molten zone thereby yielding rapid diffusion of the molten zone through the substrate. The absolute temperature distribution in the molten zone may be maintained approximately constant throughout the process yielding more uniform constituent characteristics in the wake of the molten zone. In an embodiment of the invention, the energy which is input into the molten zone may be varied during the zone's migration through the substrate yielding a spatially varying concentration in the zone's wake.

While the selective heating of the molten zone may be effected by any appropriate technique, a specifically advantageous technique involves radiating the molten zone with appropriate electromagnetic radiation, for example, coherent or incoherent light. In such embodiments, the light may be transmitted through the substrate to the molten zone, which may be absorptive by virtue of its composition, or may be rendered absorptive by virtue of other effects. In those configurations where the radiation is transmitted through the substrate to the molten zone, that portion of the substrate through which the radiation is transmitted may be inherently transparent to the radiation or may be rendered transparent by external means.

DETAILED DESCRIPTION

The physical and chemical phenomena associated with temperature gradient zone melting processes are well-known and are discussed in detail in references available to those skilled in the art, such as those cited above. The basic characteristic of the process is the establishment of a temperature gradient across an appropriate solute-solvent molten zone. The solute-solvent phase properties of the molten zone are such that the species of the matrix, within which the molten zone exists, is more concentrated in the hotter regions of the molten zone than in the cooler regions of the molten zone. The resultant diffusion of matrix species from the hotter regions of the molten zone to the cooler regions stimulates further melting of the matrix material adjoining the high temperature face of the molten zone. On the other hand, the resultant increased concentrations of the matrix species in the cooler region of the molten zone yields solidification of the material at the cool interface. The molten zone thus migrates through the matrix under the influence of the matrix species diffusion through the molten zone, which diffusion acts as a driving force for the migration of the molten zone through the matrix.

Figure 1:
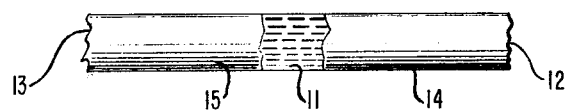
FIG. 1 is a schematic representation of the prior art temperature gradient zone melting process.

FIG. 1 is a schematic representation of the prior art temperature gradient zone melting process applied to a rod of appropriate material. In this FIG., 11, is the molten zone. The temperature gradient is established by means of appropriate thermal sources and/or sinks which yield an increased temperature at 12 and a decreased temperature at 13. As discussed above, under the influence of this temperature gradient, the molten zone 11 traverses the substrate matrix 14 leaving in its wake solid material 15 whose constituent properties are determined by the appropriate phase diagrams associated with the material, i.e., the appropriate solute-solvent system properties. Recent detailed investigations of this phenomenon have attempted to improve compositional non-uniformities associated with non-uniform thermal gradients originating with edge effects, and to increase the rate of diffusion of the molten zone through the matrix by means of increased temperatures.

It should be noted that the dopant concentration in the region 15 is a necessary function of the temperature on the cool face in the molten zone, 11. In the prior art, this temperature differs as one traverses the substrate, thereby yielding a spatially varying dopant concentration which is not always desirable, and which in at least some cases, precludes effective semiconductor processing.

Figure 2:
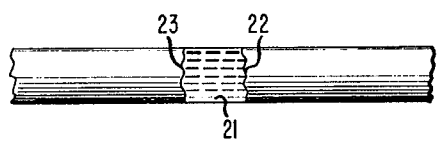
FIG. 2 is a schematic representation of the inventive selectively-heated-molten-zone temperature-gradient-zone-melting-process.

An element in this invention may be more easily understood by considering the schematic representation of FIG. 2. In this FIG., the temperature gradient is established selectively across the molten zone 21 rather than across the entire substrate (note the face 22 is relatively hot and the face 23 is relatively cool). The temperature gradient is made to follow the molten zone as it traverses the substrate. Appropriately designed RF susceptors would be one way to establish such a moveable temperature gradient. An advantage of such an embodiment is that the entire substrate need not be heated. In the prior art embodiment of FIG. 1, the melting temperature of the substrate must be higher than that of the molten zone in order to avoid melting the entire structure during processing. However, in the selective heating of FIG. 2, the melting temperature of the substrate is of diminished concern, since only the molten zone is heated during processing. Furthermore, in the embodiment of FIG. 2, the absolute temperature distribution of the molten zone is maintained constant throughout the process, unlike the prior art embodiment of FIG. 1 where the absolute temperature distribution of the molten zone varies as the molten zone traverses the matrix. The consistency in the absolute temperature distribution associated with the molten zone in FIG. 2 yields a processed substrate with more uniform compositional characteristics. Additionally, the magnitude of the temperature gradient which is established across the molten zone in the embodiment of FIG. 2 may be much greater than that in the prior art embodiments, yielding an increased diffusion rate of the molten zone through the substrate without concomitant deleterious high temperature effects appearing in the substrate.

The embodiment of FIG. 2 may appear to be somewhat similar to that in the embodiment of FIG. 3b in U.S. Pat. No. 2,813,048 (discussed at column 6, lines 63ff in that patent). However, it will be appreciated that in the embodiment of FIG. 3b of the referred to patent, the matrix is heated to yield the necessary temperature gradient, whereas in the embodiment of FIG. 2 of this patent, the temperature gradient is established by selective heating of the molten zone only. While an aspect of this invention, is the establishment of a temperature gradient across the molten zone by selective heating of the molten zone, some embodiments may involve substantially uniform heating of the substrate to achieve additional benefits.

Figure 3:
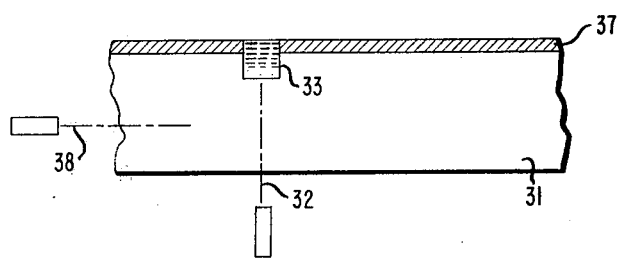
FIGS. 3 and 4 are schematic representations of the photo-induced embodiment of the inventive temperature gradient zone melting process.
Figure 4:
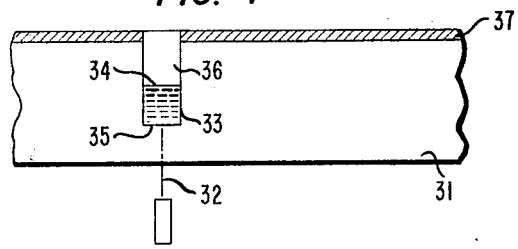

A particularly useful embodiment of this invention is shown in FIGS. 3 and 4. In these FIGS., 31 is an appropriate matrix and 32 is impinging radiation whose selective absorption yields the desired temperature gradient zone melting. In this embodiment, 31 may be a semiconductor (e.g., silicon, germanium, gallium arsenide) in which case, 32, may be light at a wavelength below the bandgap absorption. As a result, 31 is essentially transparent to the light 32. 37 is a layer of material which absorbs the radiation 32 resulting in an absorbing molten zone 33 comprising material 37 and material 31. In specific embodiments, material 37 may be material which is desirable in the substrate 31 in small quantities, i.e., it may be a desirable impurity or dopant, e.g., germanium, aluminum, boron.

Absorption of the radiation by the molten zone heats the material sufficiently to maintain its molten state. In view of the well known Beers Law drop-off in the intensity of the absorbed radiation, the initially encountered surface 35 of the molten zone absorbs greater amounts of radiation than the far side of the molten zone 34. Surface 35 (FIG. 4) of the molten zone is consequently raised to a higher temperature than surface 34 and the desired temperature gradient is thereby established. In this manner, the selective heating of the molten zone yields the desired temperature gradient.

It will be appreciated that the molten zone progresses in the direction of the impinging radiation by virtue of the fact that it proceeds along the temperature gradient, and by virtue of the fact that the temperature gradient is established through absorption of the impinging radiation. Consequently, full advantage of this embodiment is taken when the radiation is directed. In such an embodiment, the molten zone progresses toward the direction from which the radiation impinges upon the body. Relative motion of the body and the direction of radiation may yield a desirable complicated path of migration of the molten zone through the body.

Alternative embodiments of the invention may include in addition to the selective heating of the molten zone, the relatively uniform heating of the entire substrate in order to obtain additional advantages. However, this additional heating is not the primary cause for the temperature gradient, and, the preferential heating of the molten zone to establish the temperature gradient distinguishes this invention from prior art processes where the temperature gradient was established by heating large segments of the substrate, if not the entire substrate.

As a result of the phenomenon discussed above, the molten zone 33 is drawn through the substrate 31, as shown in FIG. 4. In this FIG., 36 is the wake of the molten zone which has been processed by the passage of the molten zone and which consequently comprises substrate 31 doped with material 37.

As discussed above, the molten zone 33 contains a relatively high concentration of material 37, which may contribute to the absorption of the radiation 32, although the undoped substrate 31 continues to transmit the radiation. It has been assumed that the inherent properties of the materials, combined with the characteristics of the impinging radiation, yields the requisite selective absorption, while the substrate remains essentially transparent. However, these properties need not be inherent, but might rather be effected by external means 38 which might include appropriate fields, which, in their interaction with the substrate 31, appropriately alter the absorptive properties of the material. So, for example, in FIG. 3, the material may be rendered absorptive not by means of the layer 37, but rather by the interaction at the intersection of means 38 and 32 where, for example, both 38 and 32 are appropriate light beams. In this manner, the migrating zone may be made to describe a three dimensional pattern in the substrate by appropriately guiding the intersection of 38 and 32 through the material.

Both 38 and 32 may take the form of any type of field which in its interaction with the material yields the requisite selective absorption. However, optical radiation for example, of wavelength between 0.4 and 15 microns, is found to be particularly useful in this regard, and laser light is found to be a particularly viable source, especially from a commercial standpoint.

The means which is used to cause selective absorption need not be applied necessarily in a Continuous Wave mode. Specifically, applicants have found that when laser light is used, kilohertz pulse rates might be employed without losing the essentially molten nature of the migrating zone. This indicates that a scanning laser beam may be used to create a planar vertical junction.

As discussed above, the impinging radiation does not simply replace the conventional heat source of prior art processes, but rather provides a means of selectively heating the molten zone without heating the remainder of the substrate. Relatively translating the substrate and the source will result in formation of a diffused region of more complex geometry which may be desirable in specific device embodiments. Altering the power of the impinging radiation during the processing will yield a diffused region of spatially varying dopant concentration.

If zone migration does not penetrate the front of the surface wafer, fracture may be initiated by zone expansion which accompanies the internal solidification process. This phenomenon may be used as a device separation technique in semiconductor processing.

EXAMPLE

In this example, molten zones were diffused through silicon slices by means of the inventive temperature gradient zone melting process. The experiments utilized a Coherent Radiation model 42 $CO_2$ laser as a source of 10.6 micron light to heat the molten zone. Silicon substrate slices were 10 ohm cm, N and P type, (100) and (111) orientation, of thickness from 5–20 mil. The front surfaces of the silicon slices were syton polished. A dopant metallization of Al, Au or Ga was vapor deposited on the back surface with a layer surface from 500 A to 10 microns. The laser was operated in the CW mode and focused with a germanium lens to a spot of 100 microns.

Aluminum zone migration was found to be more reproducible when a five minute alloying heat treatment in an argon environment at 600 degrees C. preceeded the photo-induced temperature gradient zone melting. The laser light was capable of vaporizing aluminum from the back surface when an interfacial layer inhibited initiation of the zone melting process. When a 5 mil thick wafer with a 1000 A aluminum metallization on the polished backside was exposed to a laser power of $2 \times 10^{4w}/cm^2$ the aluminum silicon liquid zone emerged on the front surface subsequent to diffusion through the substrate in 10 seconds.

Any mechanism which enhances absorption of laser light in the substrate can initiate total absorption by the process of free carrier production during thermal runaway, as the intrinsic absorption coefficient of silicon at 10.6 microns increases by nearly 5 orders of magnitude from room temperature to 600 degrees C. Thus, a surface hydrocarbon film, or incident ionizing radiation, can confine absorption to a specific region and prevent migration of the zone.

In addition to rectifying current voltage characteristics, Scanning Electron Microscopy charge collection micrographs confirmed that a P-N junction was formed using this technique. The near background level collection efficiency in the recrystallized zone indicates a lifetime of approximately 10 microseconds in this region.

What is claimed is:

1. A process comprising
    maintaining a temperature gradient across a molten zone which exists within a body, the said body comprising a first material and the said molten zone comprising the first material and at least one second material, the said temperature gradient having associated with it a high temperature interface between the molten zone and the body, and a cool temperature interface between the molten zone and the body, the high temperature interface being at a temperature sufficiently high to progressively melt the body and the cool temperature interface being at a temperature sufficiently low so that material from the molten zone solidifies at the cool temperature interface, whereby the molten zone progresses through the body;

the invention CHARACTERIZED IN THAT the molten zone within the body is preferentially heated to establish the temperature gradient.

2. The procress of claim 1 whereby the molten zone is preferentially heated by exposing the body to energy for which the molten zone is absorptive and for which the body is substantially transparent.

3. The process of claim 2 wherein the energy is directed energy.

4. The process of claim 3 wherein the directed energy comprises a beam of optical electromagnetic radiation of wavelength between 0.4 and 15 microns.

5. The process of claim 4 wherein the directed optical energy comprises laser light.

6. The process of claims 1 or 4 wherein the body is a semiconductor material.

7. The process of claim 6 wherein the at least one second material is a material which alters the conductivity properties of the semiconductor.

8. The process of claim 1 wherein the molten zone is rendered absorptive by exposing the molten zone to appropriate electromagnetic radiation.

9. The process of claim 1 wherein the body is rendered transparent by exposing it to electromagnetic radiation.

10. The process of claim 2 wherein the preferential heating of the molten zone occurs at the intersection of two light beams.

11. The process of claim 6 wherein the body comprises material selected from the group consisting of silicon, germanium and gallium arsenide.

12. The process of claim 7 wherein the second material is selected from the group consisting of aluminum, gallium, arsenic, and boron.

13. The process of claim 1 wherein the molten zone comprises material which expands upon cooling and wherein the molten zone is allowed to cool prior to complete passage through the body, whereby the body is cleaved upon expansion of the cooling molten zone.

14. The process of claim 1 wherein the absolute temperature characteristic of the molten zone is varied during migration of the molten zone through the body thereby yielding a spatially varying composition in the wake of the molten zone.

15. The process of claims 4 or 5 wherein the optical energy absorbed by the molten zone is varied during migration of the molten zone through the body thereby yielding a spatially varying composition in the wake of the molten zone.

16. The process of claim 5 wherein the laser light is pulsed.

17. The process of claim 5 wherein the laser light is Continuous Wave light.

18. The process of claim 17 wherein the laser beam scans the substrate to yield a planar region of processed material.

19. The process of causing at least one liquid solid interface to progress within a body of first material comprising contacting said body with a second material and producing a temperature gradient across a portion of the body of first material such that the part of the body of first material in contact with the second material is at a temperature which is at least as great as that of the lowest melting mixture of the said second material and the said first material, and such that some other part of the said body is at a temperature higher than that of the part of the said body in contact with the said second material and lower than the melting point of the first material whereby a molten region containing a solution of the said second material and the said first material is formed in the region of contact and whereby the liquid solid interface of the said molten region closest to the high temperature end of the temperature gradient progresses in that direction by progressively melting the solid material at that interface, the invention CHARACTERIZED IN THAT the temperature gradient is established selectively across the molten region by exposing the body to energy for which the molten region is absorptive and for which the remainder of the body is substantially transparent.

* * * * *